(12) United States Patent
Latina

(10) Patent No.: US 11,615,979 B2
(45) Date of Patent: Mar. 28, 2023

(54) METHOD OF PROCESSING WAFER

(71) Applicant: DISCO CORPORATION, Tokyo (JP)

(72) Inventor: Steve Latina, Andover, MA (US)

(73) Assignee: DISCO CORPORATION, Tokyo (JP)

( * ) Notice: Subject to any disclaimer, the term of this patent is extended or adjusted under 35 U.S.C. 154(b) by 195 days.

(21) Appl. No.: 16/718,506

(22) Filed: Dec. 18, 2019

(65) Prior Publication Data
US 2021/0193502 A1 Jun. 24, 2021

(51) Int. Cl.
*H01L 21/304* (2006.01)
*H01L 21/687* (2006.01)
*C09K 3/14* (2006.01)

(52) U.S. Cl.
CPC ...... *H01L 21/68707* (2013.01); *C09K 3/1409* (2013.01); *H01L 21/304* (2013.01); *H10N 30/088* (2023.02)

(58) Field of Classification Search
CPC . H01L 21/68707; H01L 21/304; H01L 21/78; H10N 30/088
See application file for complete search history.

(56) References Cited

U.S. PATENT DOCUMENTS

| | | | |
|---|---|---|---|
| 7,322,100 B2 * | 1/2008 | Jager | B81C 99/008 257/678 |
| 8,143,129 B2 * | 3/2012 | Ramkumar | H01L 21/823462 438/288 |
| 8,575,004 B2 * | 11/2013 | Tsai | H01L 31/1896 438/458 |
| 9,478,453 B2 * | 10/2016 | Graf | H01L 21/67092 |
| 9,548,247 B2 * | 1/2017 | Voerckel | H01L 23/32 |
| 10,499,509 B1 * | 12/2019 | Durocher | H05K 1/189 |
| 2001/0018229 A1 * | 8/2001 | Kato | H01L 21/6836 438/464 |
| 2001/0042902 A1 * | 11/2001 | Wakabayashi | H01L 24/27 257/E23.021 |
| 2004/0224483 A1 * | 11/2004 | Takyu | H01L 21/78 438/462 |

(Continued)

FOREIGN PATENT DOCUMENTS

| | | | | |
|---|---|---|---|---|
| EP | 0800900 A1 * | 10/1997 | | B26D 7/086 |
| JP | WO2004048057 * | 3/2006 | | C03B 33/03 |

(Continued)

OTHER PUBLICATIONS

Handler mechanical debonding. Micro Materials Inc. (Aug. 2, 2016). Retrieved Nov. 18, 2021, from https://web.archive.org/web/20160802052205/http://micromaterials-inc.com/handler-mechanical-debonding.html. (Year: 2019).*

*Primary Examiner* — Jarrett J Stark
(74) *Attorney, Agent, or Firm* — Greer, Burns & Crain, Ltd.

(57) ABSTRACT

A method of processing a workpiece with a disk-shaped blade containing abrasive grains includes the steps of placing an auxiliary plate made of a material having a modulus of elasticity higher than a material of which a front surface side of the workpiece is made, on the front surface side of the workpiece, causing the blade rotated to cut into the front surface side of the workpiece to cut the workpiece as well as the auxiliary plate, and removing the auxiliary plate from the workpiece that has been cut by the blade.

6 Claims, 6 Drawing Sheets

(56) References Cited

U.S. PATENT DOCUMENTS

| | | | | |
|---|---|---|---|---|
| 2005/0059205 A1* | 3/2005 | Maki | ................... | H01L 21/6836 438/232 |
| 2005/0118933 A1* | 6/2005 | Sakai | ................... | B24B 37/042 451/41 |
| 2006/0202780 A1* | 9/2006 | Takamine | ............ | H03H 9/1085 333/193 |
| 2006/0243701 A1* | 11/2006 | Ono | ....................... | B41J 2/1628 216/27 |
| 2008/0280423 A1* | 11/2008 | Reeder | .............. | H01L 21/67092 438/465 |
| 2009/0171216 A1* | 7/2009 | Sadaka | ................. | B06B 1/0622 600/459 |
| 2012/0080690 A1* | 4/2012 | Berger | ................. | H01L 29/161 438/455 |
| 2013/0017396 A1* | 1/2013 | Shiga | .................. | H01L 21/6836 428/413 |
| 2013/0120699 A1* | 5/2013 | Ichihara | .............. | H01L 23/3114 349/110 |
| 2015/0055276 A1* | 2/2015 | Gadkaree | .............. | H01G 11/26 361/502 |
| 2015/0179521 A1* | 6/2015 | Mizomoto | ........ | H01L 21/67092 438/464 |
| 2015/0232332 A1* | 8/2015 | Magnus | .............. | B81C 1/00896 438/464 |
| 2016/0079111 A1* | 3/2016 | Graf | ....................... | H01L 23/544 438/464 |
| 2016/0079117 A1* | 3/2016 | Graf | .................. | H01L 21/67115 438/464 |
| 2017/0170159 A1* | 6/2017 | Kulkarni | ................. | H01L 25/50 |
| 2019/0088601 A1* | 3/2019 | Tsukiyama | .......... | H01L 23/3114 |
| 2020/0206842 A1* | 7/2020 | Shibata | ................... | H01L 31/18 |
| 2021/0267582 A1* | 9/2021 | Galbierz | ................. | A61B 46/20 |
| 2021/0343593 A1* | 11/2021 | Frijlink | ................... | H01L 21/78 |

FOREIGN PATENT DOCUMENTS

| | | | | |
|---|---|---|---|---|
| JP | 2009027052 A | | 2/2009 | |
| JP | 2012191098 A | * | 10/2012 | ......... H01L 21/6836 |
| JP | 2013236018 A | * | 11/2013 | |
| JP | 2016209998 A | * | 12/2016 | |
| JP | 2018137387 A | * | 8/2018 | ............. H01G 4/012 |
| JP | 2021048278 A | * | 3/2021 | ........ H01L 21/67092 |
| KR | 20210003675 A | * | 1/2021 | ....... H01L 21/67051 |

\* cited by examiner

METHOD OF PROCESSING WAFER

BACKGROUND OF THE INVENTION

Field of the Invention

The present invention relates to a method of processing a workpiece with a blade containing abrasive grains.

Description of the Related Art

In a process of fabricating piezoelectric transducers for use in oscillators or the like, a disk-shaped blade containing abrasive grains cuts into a workpiece including a piezoelectric material, i.e., piezoelectric ceramics, typified by lead zirconate titanate (PZT), for example, forming grooves in the workpiece. Piezoelectric transducers having various properties are fabricated by adjusting the width and depth of the grooves, the distance between the grooves, etc.

In order to appropriately process workpieces containing piezoelectric materials, attempts have been made to optimize processing conditions from various standpoints (see, for example, Japanese Patent Laid-Open No. 2009-27052). For example, workpieces can be processed without being damaged by appropriately adjusting the rotational speed of a blade for cutting into workpieces, the speed at which to feed workpieces with respect to the blade, the rate at which to supply water to workpieces, etc.

SUMMARY OF THE INVENTION

For forming deep grooves in a workpiece with a blade according to the process described above, it is necessary to keep an outer circumferential portion of the blade sufficiently exposed from a disk-shaped base that fixes a central region of the blade. In other words, it is necessary to establish a sufficiently large distance, also referred to as a cutting edge protrusion range, from an edge of the base to an outer circumferential edge of the blade.

On the other hand, if the distance from the edge of the base to the outer circumferential edge of the blade is too large compared with the thickness of the blade, then when the blade cuts into the workpiece, the blade tends to be greatly deformed thicknesswise thereof, resulting in a reduction in the processing accuracy with which the blade cuts into the workpiece. Particularly, the processing accuracy is likely to drop largely in a case where the blade cuts into a workpiece whose surface layer is made of a soft material.

It is therefore an object of the present invention to provide a new method of processing a workpiece highly accurately with a blade containing abrasive grains.

In accordance with an aspect of the present invention, there is provided a method of processing a workpiece with a disk-shaped blade containing abrasive grains, including the steps of placing an auxiliary plate made of a material having a modulus of elasticity higher than a material of which a front surface side of the workpiece is made, on the front surface side of the workpiece, causing the blade rotated to cut into the front surface side of the workpiece to cut the workpiece as well as the auxiliary plate, and removing the auxiliary plate from the workpiece that has been cut by the blade.

According to the aspect of the present invention, the material of the auxiliary plate may have a Young's modulus of 40 GPa or higher at room temperature.

According to the aspect of the present invention, the blade may cut into the front surface side of the workpiece under such a condition that a value calculated by dividing a cutting edge protrusion range of the blade by a thickness of the blade is 25 or higher.

According to the aspect of the present invention, the workpiece may be made of a material including piezoelectric ceramics.

According to the aspect of the present invention, ultrasonic oscillations may be applied to the blade when the blade rotated is caused to cut into the front surface side of the workpiece.

In the method of processing a workpiece according to the aspect of the invention, an auxiliary plate made of a material having a higher modulus of elasticity than a material of a front surface side of the workpiece is placed on the front surface side of the workpiece, and a blade rotated is caused to cut into the front surface side of the workpiece to cut the workpiece as well as the auxiliary plate. While the workpiece is being processed, therefore, the auxiliary plate that is less likely to be deformed than the front surface side of the workpiece exists at a position adjacent to the blade, thicknesswise thereof.

Since the blade is sandwiched thicknesswise thereof by the auxiliary blade that is less liable to be deformed while the blade is processing the workpiece, the blade is less likely to be deformed thicknesswise thereof than would be if the auxiliary plate were not used. Consequently, the possibility that the processing accuracy for the workpiece may be lowered due to deformation of the blade is reduced.

For example, the blade is prevented from vibrating or fluctuating thicknesswise thereof, thereby preventing grooves formed in the workpiece from being much wider in their openings or upper end portions thereof than in their bottoms or lower end portions. Moreover, the blade is prevented from flexing, thereby preventing grooves from being formed skew in the workpiece. The method of processing a workpiece according to the aspect of the present invention is therefore able to process the workpiece highly accurately with ease.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1A:
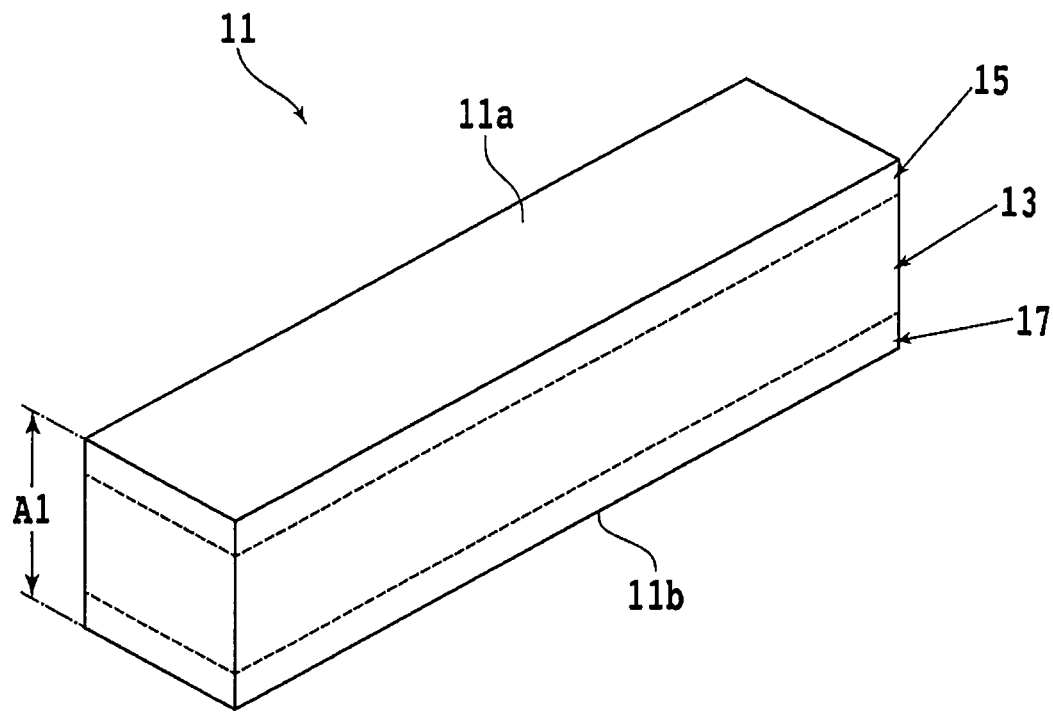
FIG. 1A is a perspective view of a workpiece to be processed by a method of processing a workpiece according to an embodiment of the present invention.
Figure 1B:
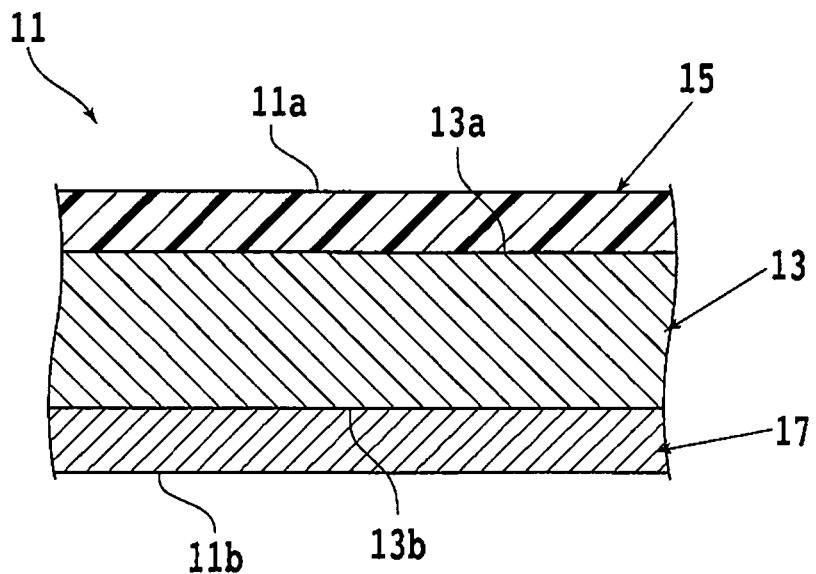
FIG. 1B is a fragmentary cross-sectional view of the workpiece.

A method of processing a workpiece according to an embodiment of the present invention will be described in detail below with reference to the accompanying drawings. FIG. 1A illustrates in perspective a workpiece 11 to be processed by a method of processing a workpiece according to an embodiment of the present invention. FIG. 1B illustrates the workpiece 11 in fragmentary cross section. As illustrated in FIGS. 1A and 1B, the workpiece 11 has a base 13 shaped as a rectangular parallelepiped, which is made of piezoelectric ceramics such as lead zirconate titanate (PZT), lead titanate (PT), barium titanate, or bismuth titanate, for example.

The base 13 includes a first surface 13a on which there is disposed a plate-shaped first layer 15 made of a material such as resin or graphite. The base 13 also includes a second surface 13b which is positioned opposite the first surface 13a and on which there is disposed a plate-shaped second layer 17 made of a material such as tungsten carbide. In other words, the base 13 shaped as a rectangular parallelepiped is sandwiched between the plate-shaped first layer 15 and the plate-shaped second layer 17.

The first layer 15 has an exposed surface facing away from the base 13 as a front surface 11a of the workpiece 11. The second layer 17 has an exposed surface facing away from the base 13 as a back surface 11b of the workpiece 11. In other words, the back surface 11b of the workpiece 11 is positioned opposite the front surface 11a of the workpiece 11.

Each of the front surface 11a and the back surface 11b of the workpiece 11 is generally flat and has a rectangular shape. The front surface 11a and the back surface 11b lie generally parallel to each other. The front surface 11a and the back surface 11b are spaced from each other by a distance A1 that is typically 1 mm or more. The distance A1 represents the thickness of the workpiece 1. The distance A1 may alternately be smaller than 1 mm.

According to the present embodiment, the workpiece 11 is illustrated as having the base 13, the first layer 15, and the second layer 17. However, the workpiece 11 is not limited to any particular structures. For example, the workpiece 11 may have only the base 13 or may have the base 13 and any number of layers. Similarly, the workpiece 11 is not limited to any particular material. For example, the workpiece 11 may be made of other piezoelectric materials, semiconductors, metals, resins, glass, ceramics, etc.

Figure 2:
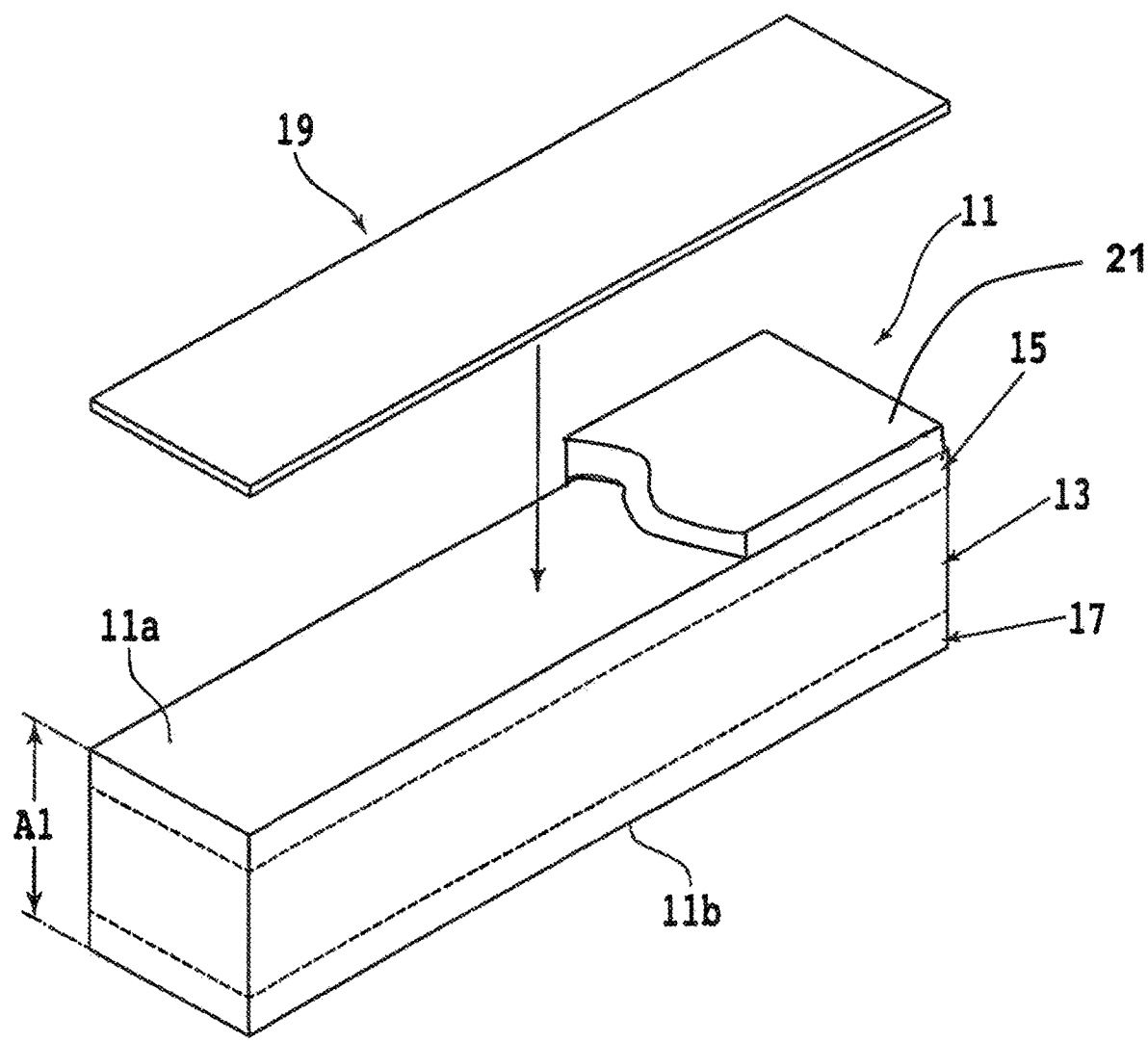
FIG. 2 is a perspective view illustrating the manner in which an auxiliary plate is placed on a front surface side of the workpiece.

In the method of processing a workpiece according to the present embodiment, an auxiliary plate is initially placed on the front surface 11a side of the workpiece 11 (auxiliary plate placing step). FIG. 2 illustrates in perspective the manner in which an auxiliary plate 19 is placed on the front surface 11a side of the workpiece 11. As illustrated in FIG. 2, the auxiliary plate 19 is of a plate shape having a pair of surfaces that is of substantially the same size as the front surface 11a of the workpiece 11.

The auxiliary plate 19 is made of a material having a higher modulus of elasticity compared with the material of the front surface 11a side of the workpiece 11, i.e., the first layer 15 in the present embodiment. The modulus of elasticity is represented by a value calculated by dividing a stress, i.e., an external force, applied to an object by an amount of strain caused by the stress, and indicates the relationship between stresses and strains at the time the object is elastically deformed.

In the case where the auxiliary plate 19 is made of a material having a higher modulus of elasticity compared with the material of the front surface 11a side of the workpiece 11 according to the present embodiment, when a force is applied to the workpiece 11, the strain caused in the auxiliary plate 19 is smaller than the strain caused in the front surface 11a side of the workpiece 11. In other words, the auxiliary plate 19 is less liable to be deformed than the front surface 11a side of the workpiece 11.

The modulus of elasticity may, for example, be Young's modulus, i.e., tensile modulus of elasticity. The Young's modulus at room temperature, i.e., 300 K or 27° C., of a resin of which the first layer 15 of the workpiece 11 may possibly be made is typically less than 4 GPa. The Young's modulus at room temperature of graphite of which the first layer 15 may possibly be made is typically less than 20 GPa. According to the present embodiment, therefore, the auxiliary plate 19 is made of a material whose Young's modulus at room temperature is 20 GPa or higher, for example.

However, the Young's modulus of the material of the auxiliary plate 19 should desirably be sufficiently higher than the Young's modulus of the material of the front surface 11a side of the workpiece 11, i.e., the first layer 15 thereof. As the Young's modulus of the material of the auxiliary plate 19 is sufficiently higher than the Young's modulus of the material of the front surface 11a side of the workpiece 11, a blade, to be described later, that is used to process the workpiece 11 is less likely to be deformed thicknesswise thereof.

Specifically, it is desirable to use an auxiliary plate 19 made of a material whose Young's modulus at room temperature is 40 GPa or higher, and more desirable to use an auxiliary plate 19 made of a material whose Young's modulus at room temperature is 60 GPa or higher. Those materials include, for example, silicon whose Young's modulus at room temperature is approximately 190 GPa, silicon carbide whose Young's modulus at room temperature is in the range from approximately 150 to 600 GPa, soda glass whose Young's modulus at room temperature is in the range from approximately 70 to 75 GPa, quartz glass whose Young's modulus at room temperature is in the range from approximately 70 to 75 GPa, and alumina whose Young's modulus at room temperature is in the range from approximately 350 to 400 GPa.

However, the auxiliary plate 19 is not limited to any particular material. For example, the auxiliary plate 19 may be made of metals whose Young's moduli satisfy the above relationships. According to the present embodiment, the material of the auxiliary plate 19 is determined on the basis of the Young's modulus that is a kind of modulus of elasticity. However, the material of the auxiliary plate 19 may also be determined on the basis of shear modulus of elasticity, bulk modulus of elasticity, or the like.

The auxiliary plate 19 is not limited to any particular thicknesses. If the auxiliary plate 19 has a thickness of 50 μm or larger, or preferably a thickness of 70 μm or larger, then the auxiliary plate 19 is less liable to be damaged when the workpiece 11 is processed. If the auxiliary plate 19 has a thickness of 150 μm or smaller, or preferably a thickness of 130 μm or smaller, then an outer circumferential portion of a blade to be used later to process the workpiece 11 is not exposed excessively from a base. According to the present embodiment, the auxiliary plate 19 is made of silicon and has a thickness of 100 μm.

When the auxiliary plate 19 is to be placed on the front surface 11a side of the workpiece 11, an adhesive layer 21 made of a tentative adhesive, wax, or the like for achieving temporary adhesive bonding is interposed between the front surface 11a of the workpiece 11 and the auxiliary plate 19, for example. The auxiliary plate 19 thus stuck and fixed to the workpiece 11 by the adhesive layer 21 is prevented from moving when the workpiece 11 is processed, and hence the processing accuracy with which the workpiece 11 is cut is not reduced.

Figure 3:
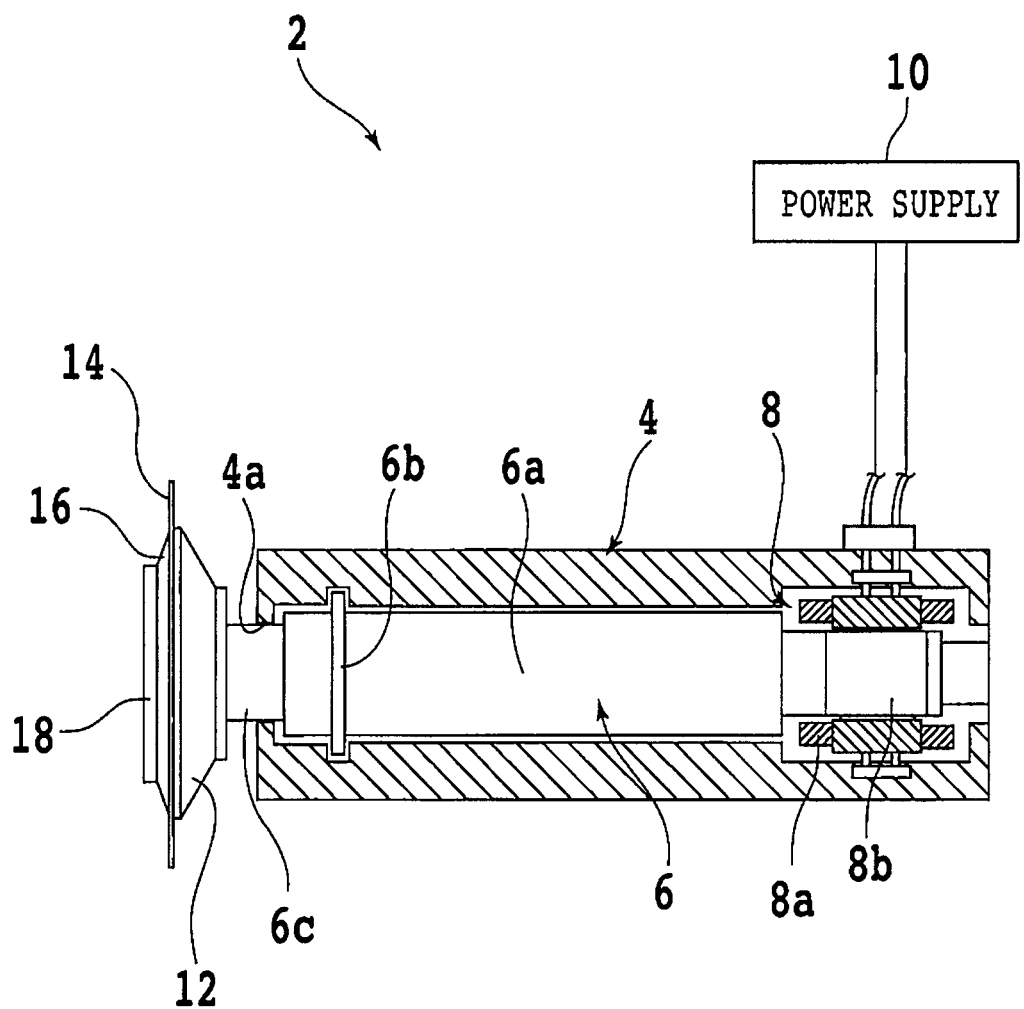
FIG. 3 is a cross-sectional view illustrating by way of example the structure of a cutting unit.

After the auxiliary plate 19 has been placed on the front surface 11a side of the workpiece 11, a disk-shaped blade containing abrasive grains is caused to cut through the auxiliary plate 19 into the front surface 11a side of the workpiece 11, cutting the auxiliary plate 19 and the workpiece 11 (cutting step). FIG. 3 illustrates in cross section the structure of a cutting unit 2 that is used to cut the workpiece 11. In FIG. 3, a power supply 10 is represented as a functional block.

As illustrated in FIG. 3, the cutting unit 2 includes a spindle housing 4 having a hollow cylindrical shape. The spindle housing 4 houses a cylindrical spindle 6 as a rotational shaft in an inner space thereof. The spindle housing 4 has an inner wall surface having a plurality of air ejection ports not illustrated but defined therein that eject air and are working as an air bearing for supporting the spindle 6.

When air is ejected from the air ejection ports radially inwardly toward the central axis of the spindle 6, the spindle 6 is pneumatically retained in position within the spindle housing 4 in directions perpendicular to the central axis of the spindle 6. The spindle 6 includes a flange-shaped, i.e., disk-shaped, thrust plate 6b mounted radially outwardly on a side surface 6a thereof. When air is ejected from the air ejection ports axially parallel to the central axis of the spindle 6 toward the thrust plate 6b, the spindle 6 is pneumatically retained in position within the spindle housing 4 in directions parallel to the central axis of the spindle 6.

The spindle 6 has a proximal end, i.e., a right end in FIG. 3, coupled to an electric motor 8 that generates forces to rotate the spindle 6 about its central axis. The electric motor 8 includes a stator 8a fixed to the spindle housing 4 and a rotor 8b coaxially coupled to the spindle 6. The stator 8a is electrically connected to an external power supply 10. The rotor 8b rotates about its own axis under a magnetic field produced by the stator 8a with electric power supplied from the power supply 10.

The spindle housing 4 has an opening 4a defined in a distal end thereof remote from the electric motor 8. The spindle 6 has a distal end portion 6c inserted in the opening 4a and exposed out of the spindle housing 4. Specifically, the distal end portion 6c of the spindle 6 protrudes axially outwardly from the distal end of the spindle housing 4.

A disk-shaped first mount 12, i.e., base, is fixed to the distal end portion 6c of the spindle 6 that is exposed out of the spindle housing 4. The first mount 12 has a boss not illustrated but disposed centrally thereon and projecting axially away from the spindle 6, for example. A disk-shaped blade 14 having a hole defined centrally therein for receiving the boss inserted therein is mounted on the first mount 12.

The blade 14 has a pair of side surfaces that are generally flat and lie parallel to each other. The blade 14 is mounted on the first mount 12 such that the side surfaces of the blade 14 extend perpendicularly to the central axis of the spindle 6. The blade 14 is typically made of abrasive grains such as of diamond bonded together by a binder of resin, metal, or the like.

With the blade 14 mounted on the first mount 12, further, a disk-shaped second mount 16, i.e., base, is mounted on the first mount 12 with the blade 14 interposed therebetween. As with the blade 14, the second mount 16 has a hole defined centrally therein for receiving the boss of the first mount 12 inserted therein. When the second mount 16 is mounted on the first mount 12, the blade 14 is sandwiched between the first mount 12 and the second mount 16.

With the second mount 16 mounted on the first mount 12, a fixing nut 18 is threaded over and tightened on the boss of the first mount 12. The second mount 16 is now axially pressed against the first mount 12 by the fixing nut 18, gripping the blade 14 firmly between the first mount 12 and the second mount 16.

According to the present embodiment, the blade 14 has a high aspect ratio represented by a value of 25 or higher calculated by dividing the distance B1 (see FIG. 4A), i.e., a cutting edge protrusion or exposure range, from outer circumferential edges of the first and second mounts 12 and 16 to an outer circumferential edge of the blade 14 by the thickness B2 (see FIG. 4B) of the blade 14. The high aspect ratio of the blade 14 allows an outer circumferential portion of the blade 14 to be sufficiently exposed from the first and second mounts 12 and 16 by which the blade 14 is fixed in position, so that the blade 14 can form deep grooves in the workpiece 11. However, the blade 14 is not limited to have the aspect ratio specified above.

Figure 4A:
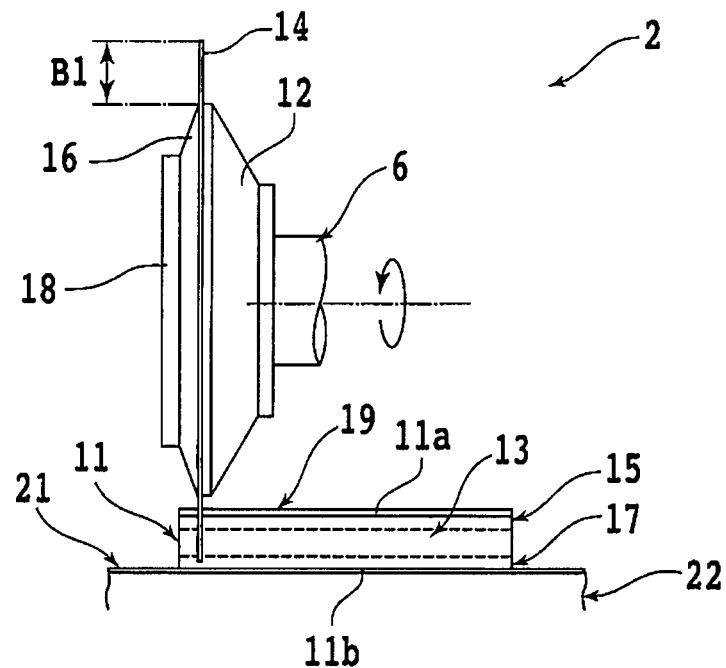
FIG. 4A is a side elevational view illustrating the manner in which the workpiece and the auxiliary plate are cut by the cutting unit.
Figure 4B:
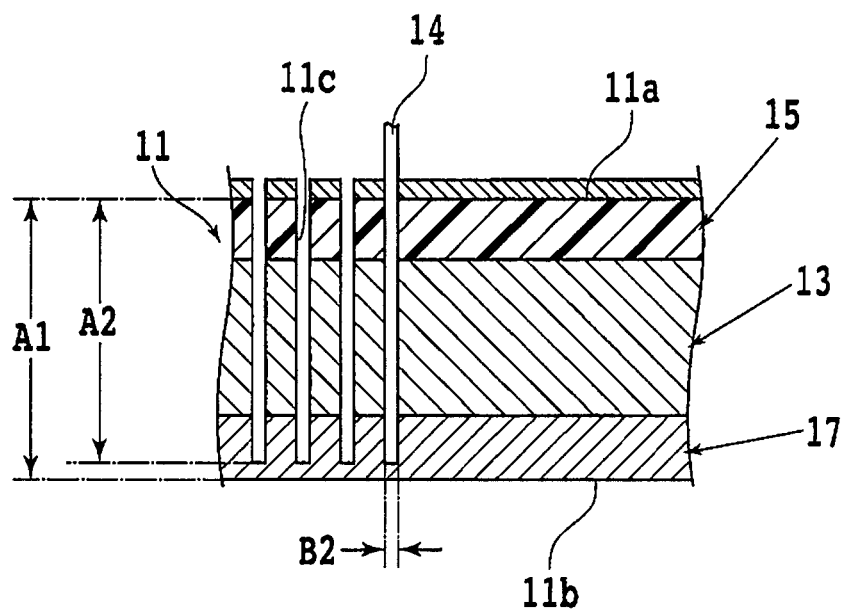
FIG. 4B is a fragmentary cross-sectional view illustrating the manner in which the workpiece and the auxiliary plate are cut by the cutting unit.

FIG. 4A illustrates in side elevation the manner in which the workpiece 11 and the auxiliary plate 19 are cut by the cutting unit 2. FIG. 4B illustrates in fragmentary cross section the manner in which the workpiece 11 and the auxiliary plate 19 are cut by the cutting unit 2. For cutting the workpiece 11 with the cutting unit 2, for example, as illustrated in FIG. 4A, the workpiece 11 is held on a chuck table 22 with an adhesive tape 21 interposed therebetween. Alternatively, the workpiece 11 may be directly held on the chuck table 22.

After the workpiece 11 has been held on the chuck table 22, the blade 14 rotated is caused to cut into the front surface 11a side of the workpiece 11. Specifically, first, one of or both the direction of the cutting unit 2 and the direction of the chuck table 22 are adjusted such that the pair of side surfaces of the blade 14 lies generally parallel to projected processing lines on the workpiece 11 on the chuck table 22.

Furthermore, one of or both the height of the cutting unit 2 and the height of the chuck table 22 are adjusted such that the blade 14 has a lower end lower than the front surface 11a of the workpiece 11 on the chuck table 22 but higher than the back surface 11b of the workpiece 11 on the chuck table 22.

In addition, one of or both the position of the cutting unit 2 and the position of the chuck table 22 are adjusted such that the blade 14 is positionally aligned with one of the projected processing lines on the workpiece 11 along directions perpendicular to the projected processing line, i.e., along the axial directions of the spindle 6. Thereafter, while the blade 14 is being rotated, the cutting unit 2 and the chuck table 22 are moved relatively to each other along a direction parallel to the projected processing line on the workpiece 11, i.e., parallel to the side surfaces of the blade 14.

The blade 14 is now caused to cut into the front surface 11a side of the workpiece 11, forming a groove 11c (see FIG. 4B) in the workpiece 11 along the projected processing line. The workpiece 11 according to the present embodiment is free of any specific pattern or the like that indicates the projected processing lines. According to the present embodiment, therefore, the projected processing line is defined by a distance from an end of the workpiece 11 to a position where the blade 14 is caused to cut into the front surface 11a side of the workpiece 11, for example. The above cutting process is, for example, repeated until grooves 11c are formed in the workpiece 11 along all the projected processing lines established on the workpiece 11.

According to the present embodiment, as described above, the blade 14 is caused to cut into the front surface 11a side of the workpiece 11 on the condition of the high aspect ratio represented by the value of 25 or higher calculated by dividing the distance B1 by the thickness B2. Consequently, sufficiently deep grooves 11c can be formed in the workpiece 11. For example, it is also possible to form deep grooves 11c having such dimensions that a value calculated by dividing a depth A2 of the grooves 11c by a width thereof, which is roughly equal to the thickness B2 of the blade 14, is 20 or larger.

On the other hand, providing the blade 14 is caused to cut into the front surface 11a side of the workpiece 11 on such condition of the high aspect ratio, the blade 14 tends to be largely deformed thicknesswise thereof, i.e., along directions perpendicular to the side surfaces of the blade 14 or along the central axis of the spindle 6, resulting in a reduction in the processing accuracy with which to cut the workpiece 11.

Specifically, for example, the blade 14 that has cut into the workpiece 11 is likely to vibrate or fluctuate thicknesswise thereof, tending to make grooves 11c much wider in their openings or upper end portions thereof than in their bottoms or lower end portions. Moreover, for example, the blade 14 that has cut into the workpiece 11 is likely to flex, tending to cut grooves 11c skew in the workpiece 11.

According to the present embodiment, the auxiliary plate 19 made of a material having a higher modulus of elasticity than the material of the front surface 11a side of the workpiece 11 is thus placed on the front surface 11a side of the workpiece 11, and the auxiliary plate 19 and the workpiece 11 are cut together by the blade 14. While the workpiece 11 is being processed, therefore, the auxiliary plate 19 that is less likely to be deformed than the front surface 11a side of the workpiece 11 exists at a position adjacent to the blade 14, thicknesswise thereof.

In other words, since the blade 14 is sandwiched thicknesswise thereof by the auxiliary plate 19 that is less liable to be deformed while the blade 14 is processing the workpiece 11, the blade 14 is less likely to be deformed thicknesswise thereof than would be if the auxiliary plate 19 were not used. Consequently, the possibility for the processing accuracy for the workpiece 11 to be lowered due to deformation of the blade 14 is reduced.

Figure 5A:
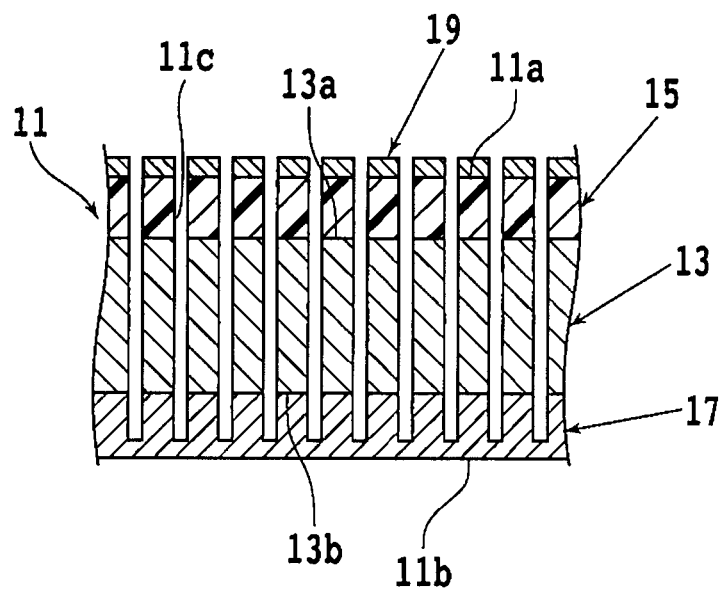
FIG. 5A is a fragmentary cross-sectional view illustrating the workpiece after the workpiece and the auxiliary plate have been cut but before the auxiliary plate is removed.
Figure 5B:
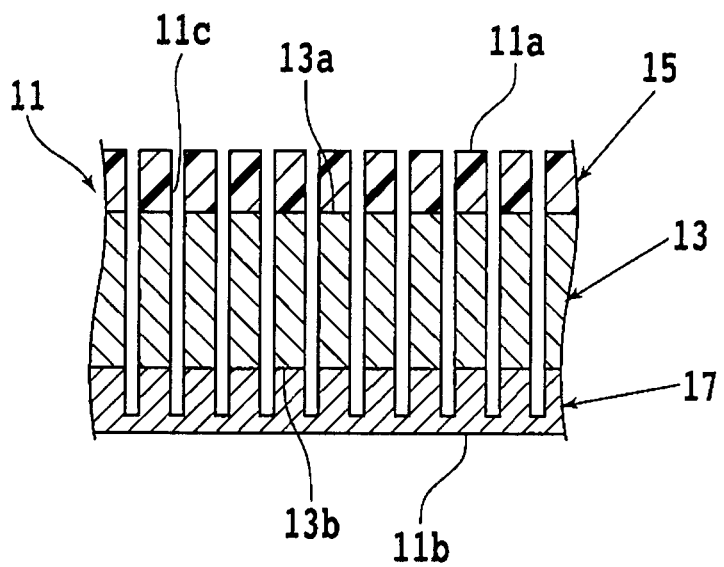
FIG. 5B is a fragmentary cross-sectional view illustrating the workpiece after the auxiliary plate has been removed therefrom.

After the blade 14 has cut into the front surface 11a side of the workpiece 11 along all the projected processing lines to cut the workpiece 11 as well as the auxiliary plate 19, the auxiliary plate 19 is removed from the workpiece 11 (removing step). FIG. 5A illustrates in cross section the workpiece 11 after the workpiece 11 and the auxiliary plate 19 have been cut but before the auxiliary plate 19 is removed. FIG. 5B illustrates in fragmentary cross section the workpiece 11 after the auxiliary plate 19 has been removed therefrom.

For removing the auxiliary plate 19 from the workpiece 11, the adhesive power of the adhesive layer that exists between the workpiece 11 and the auxiliary plate 19 is lowered by heating or the like, for example. Then, the auxiliary plate 19 is peeled off from the workpiece 11.

However, the present invention is not limited to any particular process of removing the auxiliary plate 19 from the workpiece 11. When the auxiliary plate 19 has been removed from the workpiece 11, the workpiece 11 with the deep grooves 11c defined therein that are open on the front surface 11a is completed.

As described above, in the method of processing a workpiece according to the present embodiment, the auxiliary plate 19 made of a material having a higher modulus of elasticity than the material of the front surface 11a side of the workpiece 11 is placed on the front surface 11a side of the workpiece 11, and the rotating blade 14 is caused to cut into the front surface 11a side of the workpiece 11 to cut the workpiece 11 as well as the auxiliary plate 19. Therefore, while the workpiece 11 is being processed, the auxiliary plate 19 that is less likely to be deformed than the front surface 11a side of the workpiece 11 exists at a position adjacent to the blade 14, thicknesswise thereof.

In other words, since the blade 14 is sandwiched thicknesswise thereof by the auxiliary plate 19 that is less liable to be deformed while the blade 14 is processing the workpiece 11, the blade 14 is less likely to be deformed thicknesswise thereof than would be if the auxiliary plate 19 were not used. As a result, the possibility for the processing accuracy for the workpiece 11 to be lowered due to deformation of the blade 14 is reduced. The method of processing a workpiece according to the present embodiment thus makes it possible to process the workpiece 11 more easily with higher accuracy.

The present invention is not limited to the details of the embodiment described above, and various changes and modifications may be made in the embodiment. For example, in the above embodiment, the blade 14 is of the washer type sandwiched and fixed in position between the first mount 12 and the second mount 16. However, a hub-type blade fixed in advance to a disk-shaped base may be used to process the workpiece 11 in the manner described above.

The hub-type blade should have a high aspect ratio represented by a value of 25 or higher calculated by dividing the distance, i.e., a cutting edge protrusion or exposure range, from an outer circumferential edge of the disk-shaped base to an outer circumferential edge of the blade by the thickness of the blade. The high aspect ratio of the blade allows an outer circumferential portion of the blade to be sufficiently exposed from the disk-shaped base by which the blade is fixed in position, so that the blade can form deep grooves in the workpiece 11.

Figure 6:
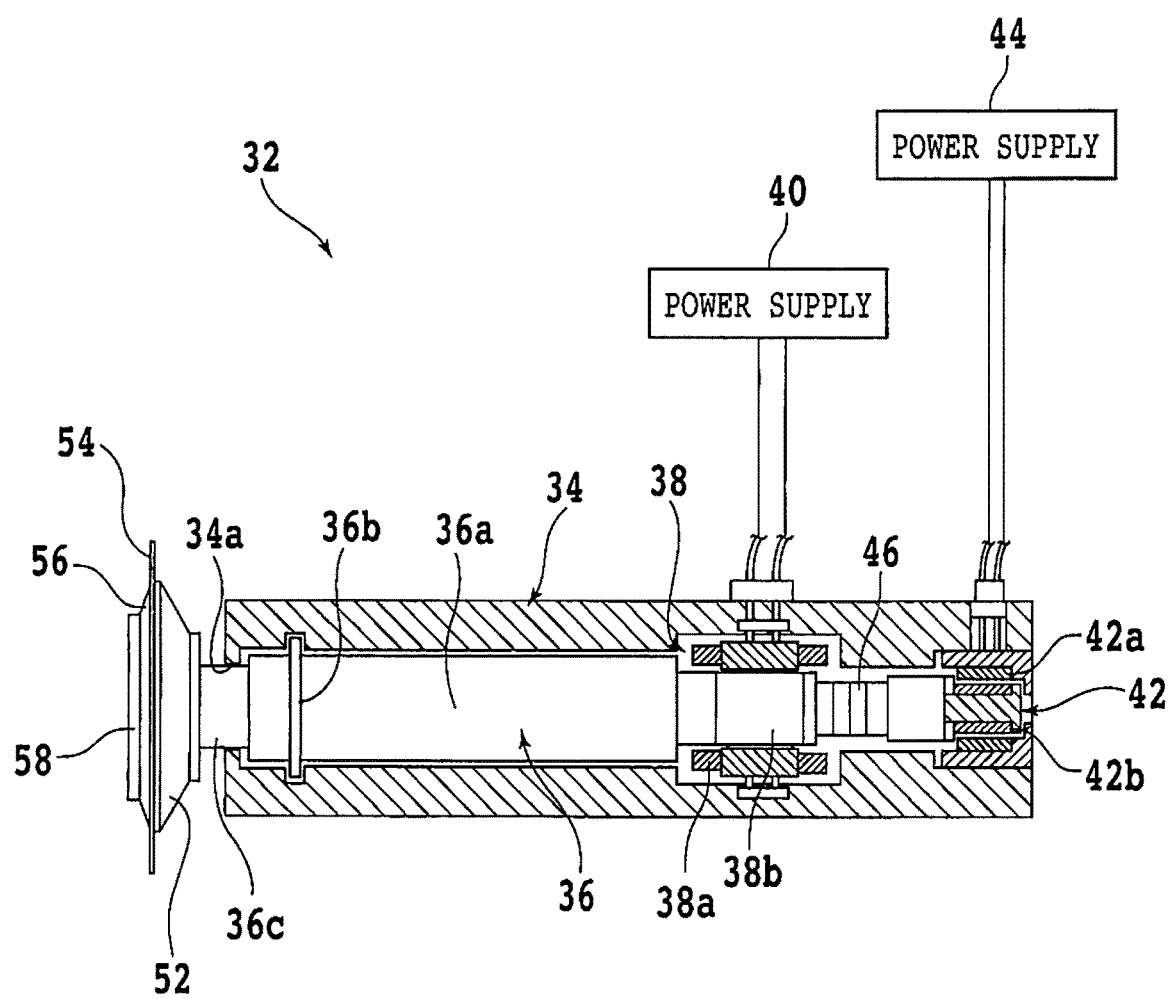
FIG. 6 is a cross-sectional view illustrating by way of example the structure of a cutting unit according to a modification.

Furthermore, when the rotating blade is caused to cut into the front surface 11a side of the workpiece 11, ultrasonic oscillations may be applied to the blade. FIG. 6 illustrates in cross section the structure of a cutting unit 32 according to a modification by way of example. In FIG. 6, power supplies 40 and 44 are represented as functional blocks. The cutting unit 32 according to the modification has a basic structure similar to the structure of the cutting unit 2 according to the above embodiment.

As illustrated in FIG. 6, the cutting unit 32 includes a spindle housing 34 having a hollow cylindrical shape. The spindle housing 34 houses a cylindrical spindle 36 as a rotational shaft in an inner space thereof. The spindle housing 34 has an inner wall surface having a plurality of air ejection ports not illustrated but defined therein that eject air and are working as an air bearing for supporting the spindle 36.

When air is ejected from the air ejection ports radially inwardly toward the central axis of the spindle 36, the spindle 36 is pneumatically retained in position within the spindle housing 34 in directions perpendicular to the central axis of the spindle 36. The spindle 36 includes a flange-shaped, i.e., disk-shaped, thrust plate 36b mounted radially outwardly on a side surface 36a thereof. When air is ejected from the air ejection ports axially parallel to the central axis of the spindle 36 toward the thrust plate 36b, the spindle 36 is pneumatically retained in position within the spindle housing 34 in directions parallel to the central axis of the spindle 36.

The spindle 6 has a proximal end, i.e., a right end in FIG. 6, coupled to an electric motor 38 that generates forces to rotate the spindle 36 about its central axis. The electric motor 38 includes a stator 38a fixed to the spindle housing 34 and a rotor 38b coaxially coupled to the spindle 36. The stator 38a is electrically connected to an external power supply 40. The rotor 38b rotates about its own axis under a magnetic field produced by the stator 38a with electric power supplied from the power supply 40.

A rotary transformer 42 is disposed on the rotor 38b at a position remote from the spindle 36. The rotary transformer 42 includes a stator 42a fixed to the spindle housing 34 and a rotor 42b coaxially coupled to the rotor 38b, i.e., the spindle 36. The stator 42a is electrically connected to an external power supply 44. The rotor 42b has terminals supplied in a contactless fashion with AC electric power from the power supply 44 through the stator 42a.

An ultrasonic oscillator 46 is connected to the terminals of the rotor 42b. The ultrasonic oscillator 46 oscillates with the AC electric power supplied from the power supply 44 through the stator 42a and the rotor 42b. According to the present embodiment, the AC electric power supplied from the power supply 44 has a frequency in a frequency range for enabling the ultrasonic oscillator 46 to generate ultrasonic oscillations.

The spindle housing 34 has an opening 34a defined in a distal end thereof remote from the electric motor 38. The spindle 36 has a distal end portion 36c inserted in the opening 34a and exposed out of the spindle housing 34. Specifically, the distal end portion 36c of the spindle 36 protrudes axially outwardly from the distal end of the spindle housing 34.

A disk-shaped first mount 52, i.e., base, is fixed to the distal end portion 36c of the spindle 36 that is exposed out of the spindle housing 34. The first mount 52 has a boss not illustrated but disposed centrally thereon and projecting axially away from the spindle 36, for example. A disk-shaped blade 54 having a hole defined centrally therein for receiving the boss inserted therein is mounted on the first mount 52.

The blade 54 has a pair of side surfaces that are generally flat and lie parallel to each other. The blade 54 is mounted on the first mount 52 such that the side surfaces of the blade 54 extend perpendicularly to the central axis of the spindle 36. The blade 54 is typically made of abrasive grains such as of diamond bonded together by a binder of resin, metal, or the like.

With the blade 54 mounted on the first mount 52, further, a disk-shaped second mount 56, i.e., base, is mounted on the first mount 52 with the blade 54 interposed therebetween. As with the blade 54, the second mount 56 has a hole defined centrally therein for receiving the boss of the first mount 52 inserted therein. When the second mount 56 is mounted on the first mount 52, the blade 54 is sandwiched between the first mount 52 and the second mount 56.

With the second mount 56 mounted on the first mount 52, a fixing nut 58 is threaded over and tightened on the boss of the first mount 52. The second mount 56 is now axially pressed against the first mount 52 by the fixing nut 58, gripping the blade 54 firmly between the first mount 52 and the second mount 56. Therefore, the ultrasonic oscillations generated by the ultrasonic oscillator 46 are transmitted through the spindle 36, etc. to the blade 54, which highly quickly expands and contracts radially due to the ultrasonic oscillations.

When the blade 54 is caused to cut into the front surface 11a side of the workpiece 11, the power supply 44 supplies electric power to the ultrasonic oscillator 46, which generates and applies ultrasonic oscillations to the blade 54. Since the blade 54 now cuts into the workpiece 11 while ultrasonically hammering the workpiece 11, the workpiece 11 is processed with greater ease.

When the blade 54 that is ultrasonically oscillated cuts into the front surface 11a side of side the workpiece 11, the front surface 11a side of the workpiece 11 tends to chip off. However, the auxiliary plate 19 placed on the front surface 11a side of the workpiece 11 has a function to prevent the workpiece 11 from chipping off on account of the ultrasonic oscillations applied to the blade 54. According to the present modification, consequently, the workpiece 11 is processed with higher processing accuracy.

A specific sequence of causing the blade 54 to cut into the workpiece 11 according to the modification may be the same as the sequence according to the above embodiment. According to the modification, the ultrasonic oscillator 46 is disposed on the proximal end side of the spindle 36. However, the ultrasonic oscillator 46 may be disposed on the blade 54.

The structural details, methods, and other details according to the embodiment and modification described above may be changed or modified within the scope of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method of processing a workpiece with a disk-shaped blade containing abrasive grains, comprising the steps of:
   preparing the workpiece having a base and including a first layer on a front surface side of the base and a second layer on a second surface side of the base, wherein said base is made of a piezoelectric material;
   placing an adhesive layer on said first layer;
   placing an auxiliary plate on said adhesive layer on said first layer, said auxiliary plate being made of a metal having a modulus of elasticity that is higher than a material of said first layer;
   causing the blade rotated to cut through the first layer and the auxiliary plate and at least partially into but not through the second layer; and
   removing the auxiliary plate from the workpiece that has been cut by the blade.

2. The method according to claim 1, wherein the material of the auxiliary plate has a Young's modulus of 40 GPa or higher at room temperature.

3. The method according to claim 1, wherein the blade cuts the first layer, the auxiliary plate and the second non-adhesive layer under such a condition that a value calculated by dividing a cutting edge protrusion range of the blade by a thickness of the blade is 25 or higher.

4. The method according to claim 1, wherein ultrasonic oscillations are applied to the blade when the blade rotated is caused to cut into the first layer, the auxiliary plate and the second non-adhesive layer.

5. The method according to claim 1, wherein the first layer is made of resin or graphite.

6. The method according to claim 1, wherein the second non-adhesive layer is made of tungsten carbide.

* * * * *